United States Patent [19]

Golder et al.

[11] Patent Number: 4,625,164

[45] Date of Patent: Nov. 25, 1986

[54] VACUUM ACTUATED BI-LEVEL TEST FIXTURE

[75] Inventors: Willis E. Golder, Holliston; Joseph A. Ierardi, Norwood; Robert E. Staples, Lakeville; Michael C. Boyle, Norton, all of Mass.

[73] Assignee: Pylon Company, North Attleboro, Mass.

[21] Appl. No.: 586,010

[22] Filed: Mar. 5, 1984

[51] Int. Cl.⁴ .............................................. G01R 31/02
[52] U.S. Cl. .............................. 324/158 F; 324/73 PC
[58] Field of Search ............... 324/158 F, 158 P, 72.5, 324/73 PC

[56] References Cited

U.S. PATENT DOCUMENTS 4,115,735 9/1978 Stanford .......................... 324/158 F

*Primary Examiner*—Ernest F. Karlsen
*Attorney, Agent, or Firm*—Weingarten, Schurgin, Gagnebin & Hayes

[57] ABSTRACT

A test fixture for selectively electrically connecting an electronic circuit device for in-circuit and functional testing by automatic testing equipment. First and second pluralities of spring-loaded probes are fastened to the test fixture for respectively providing an in-circuit contact array on a first level and a functional contact array on a second level. An electronic cicuit device receiving face is mounted to the test fixture for movement to the first level for electrically connecting the electronic circuit device to the in-circuit contact array, and for movement to the second level for electrically connecting the electronic circuit device to the functional contact array. Means including a bi-level vacuum controller are disclosed for selectively moving the electronic circuit device receiving face to the first and second levels. Means coupled to the bi-level vacuum controller are disclosed for venting the test fixture to ambient during transitions from higher to lower vacuum pressures and to the unactuated condition. The bi-level vacuum controller may be locally actuated by a system operator or remotely actuated by the automatic testing equipment.

9 Claims, 8 Drawing Figures

VACUUM ACTUATED BI-LEVEL TEST FIXTURE

FIELD OF THE INVENTION

This invention is directed to the field of automatic testing equipment, and more particularly, to a novel vacuum actuated bi-level test fixture.

BACKGROUND OF THE INVENTION

Test fixtures are commonly employed to electrically connect electronic circuit devices to be tested to automatic testing equipment operative to determine whether the electronic circuit device conforms to a predetermined standard of quality. Typically, the automatic testing equipment is operative to provide both in-circuit and functional testing. For in-circuit testing, the automatic testing equipment is operative to determine the integrity of the individual components of the electronic circuit device, such as, for example, the intended conductivity of its constituent conductive paths, and the intended resistivity of its constituent resistors. For functional testing, the automatic testing equipment is operative to determine the cooperation of the individual electronic circuit device components to provide the intended device function. It is known to provide separate test fixtures for electrically connecting electronic circuit devices to automatic testing equipment respectively for in-circuit and for functional testing. The utility of this approach is limited, however, due to the time and labor costs incurred in successively connecting the electronic circuit device to the in-circuit fixture and automatic testing equipment, and then to the functional testing fixture and automatic testing equipment; due to the storage space required to maintain an inventory of separate in-circuit and functional testing fixtures; and due to the considerable acquisition costs incurred in procuring separate in-circuit and functional test fixtures, among others. It is also known to provide a test fixture having first and second platens that are movable by first and second vacuum chamber actuators into contact with the electronic circuit device to selectively provide either in-circuit or functional testing as disclosed in U.S. Pat. No. 4,115,735 to Stanford, incorporated herein by reference. Each platen includes a plurality of probes slidably mounted in a corresponding guide that are in electrical communication by individual ones of a plurality of wires to the automatic testing equipment. The utility of this approach is limited, however, due to the increased possibility of leakage and vacuum loss from each of the first and second vacuum chamber actuators; due to the strain on the wires and on the wire/probe termination points occasioned by the movement of the platens; and due to a restriction on the total number of probes that may be employed for a nominal vacuum pressure occasioned by the vacuum leakage at the multiple probe/guide sliding interfaces, among other things.

SUMMARY OF THE INVENTION

The present invention overcomes these and other disadvantages and contemplates a bi-level test fixture having a first plurality of spring-loaded stationery probes with ends on a first level defining a first contact array for providing in-circuit testing; a second plurality of spring-loaded stationery probes with ends on a second level different from the first level defining a second contact array for providing functional testing; and an electronic circuit device receiving face selectively movable to the first and second levels for respectively providing in-circuit and functional testing. The bi-level test fixture of the present invention in preferred embodiment includes a housing defining a vacuum chamber, and a bi-level vacuum controller having first and second selectable vacuum levels coupled to the vacuum chamber. The electronic circuit device receiving face is selectively movable to the first and second levels in response to the first and second vacuum levels thereby providing both in-circuit and functional testing. The bi-level vacuum controller of the present invention preferably includes a vacuum source providing a first vacuum level, a vacuum regulator operative in response to the first vacuum level to provide a second vacuum level, and means including a valve for selectively connecting the first vacuum level and the second vacuum level to the vacuum chamber. Means including a vacuum pressure responsive switch are operative in response to a change from a larger to a smaller vacuum level to vent the vacuum chamber to ambient. Circuit means are disclosed for allowing either operator selection or remote automatic testing equipment selection of the first and second vacuum levels. Among other advantages, the vacuum actuated bi-level test fixture of the present invention substantially eliminates flexure induced strain, allows any number of probes to be employed at nominal vacuum pressure, minimizes vacuum leakage, and minimizes both storage space requirements and acquisition costs, among other things.

BRIEF DESCRIPTION OF THE DRAWINGS

Other advantages and features of the present invention will become apparent as the invention becomes better understood by referring to the following exemplary and non-limiting detailed description of the preferred embodiment, and to the drawings, wherein.

DETAILED DESCRIPTION OF THE PREFERRED EMBODIMENT

Figure 1:
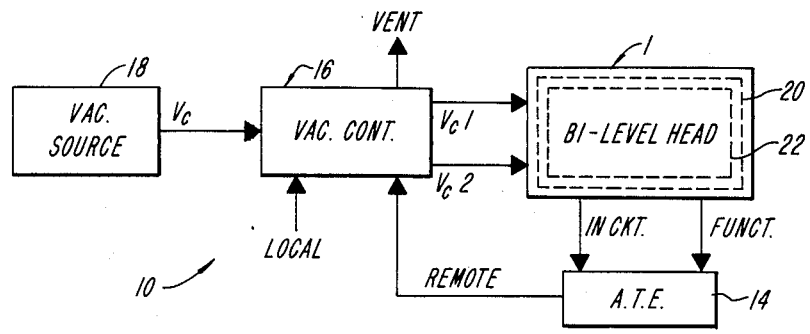
FIG. 1 is a block diagram illustrating the vacuum actuated bi-level test fixture according to the present invention.

Referring now to FIG. 1, generally designated at 10 is a block diagram illustrating the novel vacuum actuated bi-level test fixture according to the present invention. The system 10 includes a bi-level test head generally designated 12 to be described connected to automatic testing equipment 14 for providing both in-circuit and functional testing of an electronic circuit device, not shown, positioned on the head 12. A bi-level vacuum controller generally designated 16 to be described is connected to the bi-level head 12 and to a vacuum source 18. The vacuum source 18 produces a vacuum designated "$V_c$". The bi-level vacuum controller 16 is selectively operative in response to the vacuum produced by the vacuum source 18 to provide first and second vacuum levels designated "$V_c1$" and "$V_c2$" to the bi-level head 12. The bi-level test head 12 is operative in response to the first vacuum level ($V_c1$) to electrically connect the electronic circuit device positioned on the head 12 to the automatic testing equipment 14 for in-circuit testing as designated by a dashed rectangle 20, and is operative in response to the second vacuum level ($V_c2$) to electrically connect the electronic circuit device to the automatic testing equipment 14 for functional testing as designated by a dashed rectangle 22. The vacuum levels supplied to the bi-level head 12 can be selected either locally by the system operator or remotely by the automatic testing equipment, as shown by the arrows designated "local" and "remote", respectively.

Figure 2:
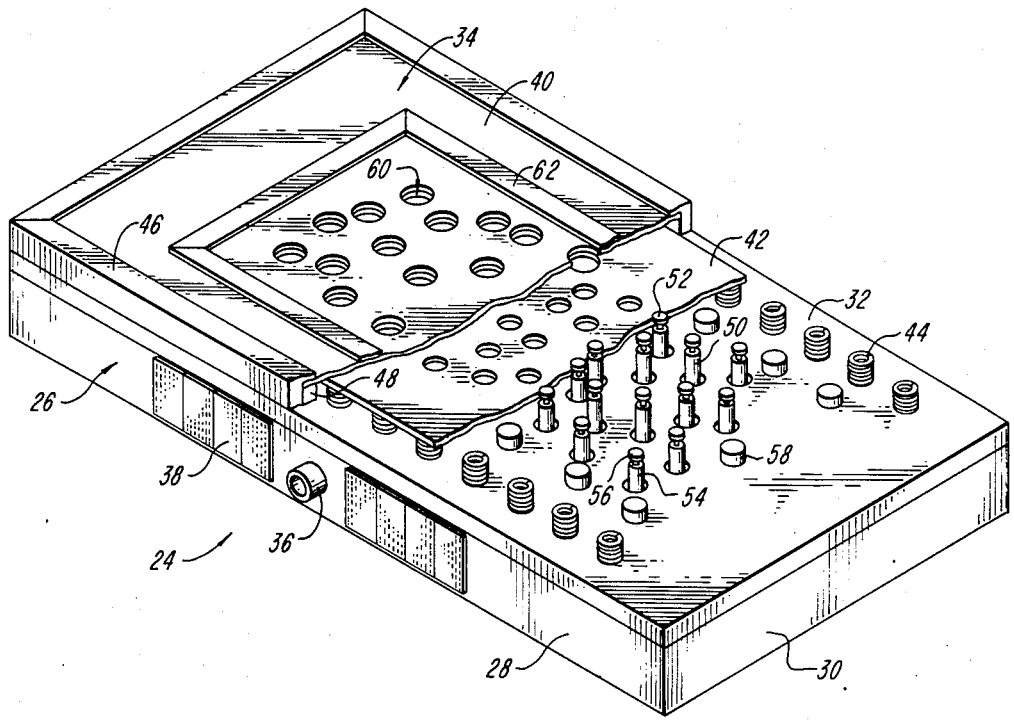
FIG. 2 is a broken away perspective view illustrating a bi-level test head of the vacuum actuated bi-level test fixture according to the present invention.

Referring now to FIG. 2, generally designated at 24 is a broken-away perspective view illustrating the bi-level test head of the vacuum actuated bi-level test fixture according to the present invention. The test head 24 includes a frame generally designated 26 having spaced, upstanding side walls 28 that are connected by spaced, upstanding end walls 30 defining an enclosure having an open top. A probe receiving plate 32 is fastened to the open top of the frame 26. A spaced-apart electronic circuit device receiving face generally designated 34 to be described is mounted for sliding motion relative to the probe receiving plate 32. A vacuum coupling 36 is mounted to one side wall 28 of the frame 26, and a plurality of test-head electrical interface connectors 38 are mounted to the same side wall 28. It should be noted that by providing the vacuum coupling 36 and the electrical interface connectors 38 on the same side wall of the frame 26, the dimensions of the side walls and of the end walls can vary to accommodate electronic circuit devices of varying physical dimensions.

The electronic circuit device receiving face 34 preferably includes a layer of elastomeric material 40 having a comparatively large cross-sectional area, and a subjacent layer 42 of rigid material having a comparatively smaller cross-sectional area adhesively fastened thereto or by any other suitable means. The electronic circuit device receiving face 34 is mounted for sliding motion relative to the probe recieving plate 32 preferably by a plurality of upstanding coil springs extending between and abutting the probe receiving plate 32 and the rigid layer 42, and by resilient hinges formed by capturing the peripheral edges of the elastomeric material 40 in air-tight channels defined between the confronting surfaces of flanges 46, 48 that are fastened in air-tight sealing engagement along the sides and ends of the probe receiving plate 32.

A first plurality of selectively spaced spring-loaded stationery probes 50 are fastened in air-tight sealing engagement to the probe receiving plate 32 with their free ends 52 constrained to lie on a first level defining a first contact array for in-circuit testing. A second plurality of selectively spaced spring-loaded stationery probes 54 are fastened in air-tight sealing engagement with the probe receiving plate 32 with their free ends 56 constrained to lie along a second level different from the first level defining a second contact array for providing functional testing. Each of the probes 50, 54 preferably is a POGO spring-loaded probe. A plurality of spring-loaded buttons 58 are mounted in air-tight sealing relation to the probe receiving plate 32. A plurality of apertures generally designated 60 are provided through the resilient layer 40 and rigid layer 42 of the electronic circuit device receiving face 34 that are in alignment with corresponding ones of the probes 50, 54 of the first and second arrays of probes. Guide flanges 62 are fastened to the resilient layer 40 of the electronic circuit device receiving face 34 for providing electronic circuit device alignment surfaces. Apertures, not shown, are provided through the probe receiving plate 32 of such dimension to couple the vacuum applied at the vacuum coupling 36 to the underside of the electronic circuit device receiving face 34. Each of the probes 50, 54 are connected by electrical wires, not shown, to an appropriate terminal of the connectors 38 for electrical interconnection to the automatic testing equipment.

Figure 3A:
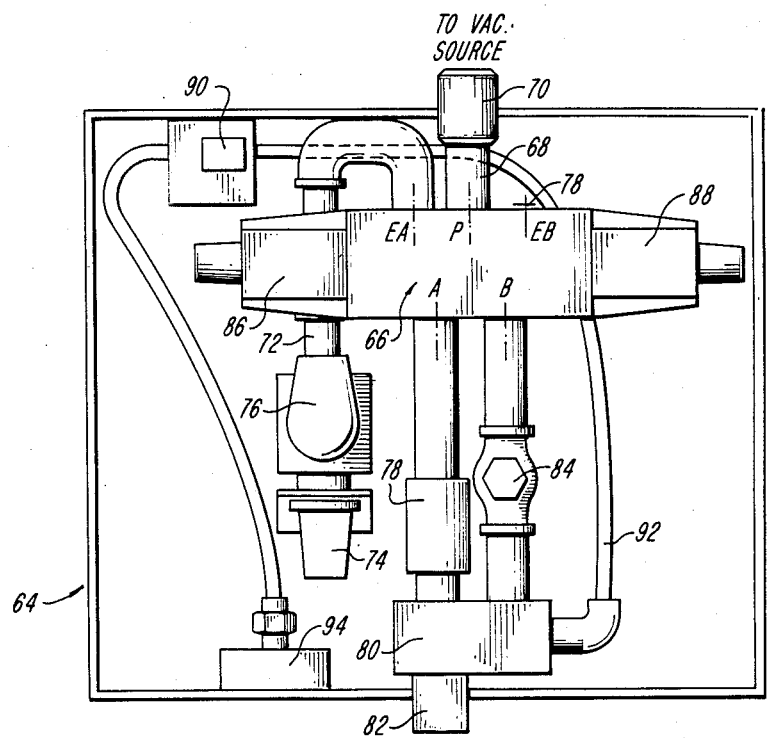
FIG. 3A is a plan view with the cover removed of a bi-level vacuum controller of the vacuum actuated bi-level test fixture according to the present invention.

Referring now to FIG. 3a, generally designated at 64 is a top plan view illustrating the bi-level vacuum controller with the cover removed of the vacuum actuated bi-level test fixture according to the present invention. The vacuum controller 64 includes a three-position spool valve 66 having ports designated "EA", "P", "EB", "A", and "B". The "P" port is connected through a nipple 68 to a hose coupling 70 to the vacuum source 18 (FIG. 1). The "EA" port of the spool valve 66 is connected through a conduit 72 to an ambient air inlet nozzle 74 via a solenoid actuated normally open valve 76 to be described. The "EB" port of the spool valve 66 is plugged as illustrated at 78. The "A" port of the spool valve 66 is connected to a coupling 82 via conduit 78 through a manifold 80 to the vacuum coupling 36 (FIG. 2) of the bi-level test head. The "B" port of the spool valve 66 is connected to the fluid manifold 80 via a vacuum regulator 84. The spool valve 66 includes solenoids 86, 88 for controlling the state of the spool valve in a manner to be described. A vacuum responsive switch 90 connected to the fluid manifold 80 via a conduit 92, and is connected to the solenoid actuated valve 76. The vacuum actuated switch 90 is operative in a manner to be described to vent ambient air to the bi-level test head 24 (FIG. 2) during transitions both from higher to lower vacuum levels and to the "off" condition. A pressure gage 92 is coupled to the fluid manifold 80 via the fluid conduit 92 for providing an operator visible indication of vacuum pressure level.

Figure 3B:
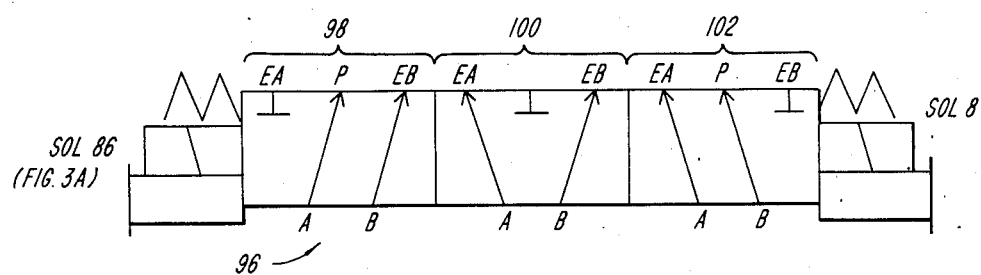
FIG. 3B is a state diagram illustrating the operating states of a spool valve of the bi-level vacuum actuator of the vacuum actuated bi-level test fixture according to the present invention.

Referring now to FIG. 3B, generally designated at 96 is a diagram illustrating the possible operating states of the spool valve 66 (FIG. 3A). The spool valve has three states designated by brackets 98, 100, and 102. Whenever the solenoid 86 (FIG. 3A) is actuated as appears more fully below, the spool valve connects the "P" port to the "A" port and the "EB" port to the "B" as illustrated by the bracket 98. The vacuum source 18 (FIG. 1) is thereby connected through the spool valve to the conduit 78 (FIG. 3A) and out the coupling 82 (FIG. 3A) to the bi-level test head 24 (FIG. 2) for applying the full vacuum to the test head. As illustrated by the bracket 100, whenever the spool is in its unactuated position the "EA" port is connected to the "A" port and the "EB" port is connected to the "B" port, with the "P" port disconnected. In the state 100, no vacuum is applied through the bi-level vacuum controller to the test head. As appears more fully below, whenever the solenoid 88 (FIG. 3A) is actuated as illustrated by the bracket 102, the "P" port is connected to the "B" port, the "EA" port is connected to the "A" port, and the "EB" port is plugged. In this manner, the level of vacuum produced by the vacuum source 18 (FIG. 1) is applied through the vacuum regulator 84 (FIG. 3A) through the fluid manifold 80 (FIG. 3A) and out the vacuum coupling 82 (FIG. 3A) for applying a lower vacuum pressure to the bi-level head 24 (FIG. 2). With the solenoid 88 actuated, the manifold 80 is also connected through the conduit 78 and through the path defined between the "A" and "EA" ports to the ambient nozzle 74 via the solenoid actuated valve 76.

Figure 4:
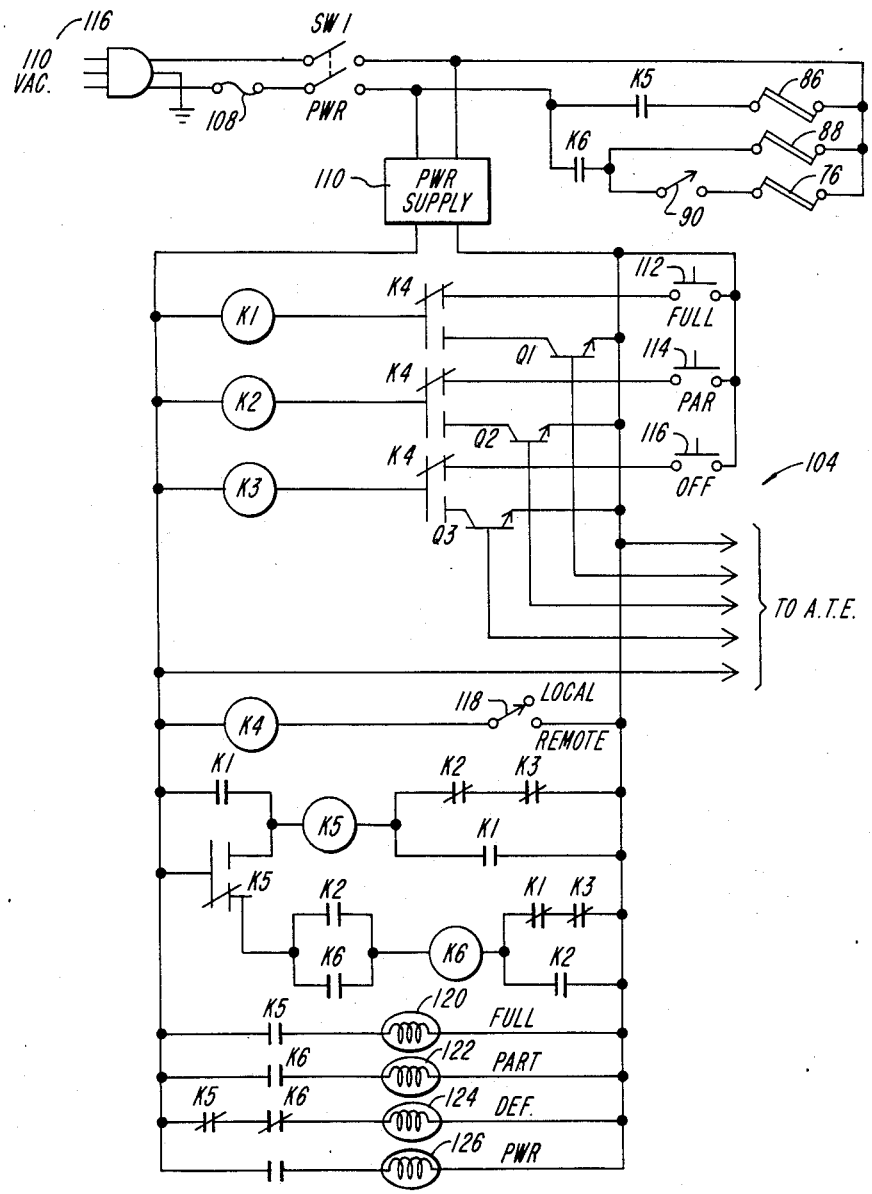
FIG. 4 is a schematic diagram illustrating a control circuit of the vacuum actuated bi-level test fixture according to the present invention.

Referring now to FIG. 4, generally designated at 104 is a schematic diagram of the electronic circuitry for actuating the solenoids 86, 88 of the spool valve 66 and of the solenoid actuated valve 76 of the bi-level vacuum actuator 64 of FIG. 3A. The solenoid 86 is connected via contact designated "K5" to a source of A/C power 106 via a fusable link 108 and an ON/OFF power switch designated "SW1". The solenoid 88 is connected via a contact "K6" to the source of A/C power 106 over the fusable link 108 and the power switch "SW1". The solenoid controlled valve 76 is connected via the vacuum actuated switch 90 and the contact "K6" to the source of A/C power 106 via the fusable link 108 and the ON/OFF switch "SW1". A power supply 110 is connected across the source of A/C power 106. A switch 112 designated "FULL" is connected in series with a normally closed contact designated "K4" to the coil of a relay designated "K1" and across the output of the power supply 110. A switch 114 designated "PAR" is connected in series with a normally closed contact designated "K4" to the coil of a relay designated "K2" across the output of the power supply 110. A switch 116 designated "OFF" is connected in series with a normally closed contact designated "K4" to the coil of a relay designated "K3" across the output of the power supply 110. The coils "K1", "K2", and "K3" are respectively connected through the normally open contacts "K4" via respective switching transistors designated "Q1", "Q2", and "Q3" to the automatic testing equipment for remote actuation and selection of the vacuum levels applied to the bi-level test fixture. A switch 118 designated "local" and "remote" is connected in series via the coil of a relay designated "K4" across the output of the power supply 110. A coil designated "K5" of a relay is connected across the output of the power supply 110 on one circuit leg through an arrangement of normally closed series connected contacts designated "K2" and "K3" that are in parallel with a normally open contact designated "K1", and on another circuit leg via a normally open contact designated "K1" and through a normally open contact designated "K5". A coil designated "K6" of a relay is connected across the output of the power supply 110 on one circuit leg through an arrangement of normally closed series connected contacts designated "K1", "K3" in parallel with a normally open contact designated "K2", and along another circuit leg via a parallel arrangement of normally open contacts designated "K2", "K6" to a normally closed contact "K5". A lamp 120 designated "FULL" is connected in series with a normally open contact designated "K5" across the output of the power supply 110. A lamp 122 designated "PART" is connected in series with a normally open contact designated "K6" across the output of the power supply 110. A lamp 124 designated "OFF" is connected in series with series connected and normally closed contacts "K5" and "K6" to the output of the power supply 110. A lamp 126 designated "PWR" is connected across the output of the power supply 110. It will be appreciated that the contacts having the same number as the coils of the associated relay are controlled in their normally "ON/OFF" states in accordance with the state of actuation of the corresponding coils bearing the same number.

Figure 5A:
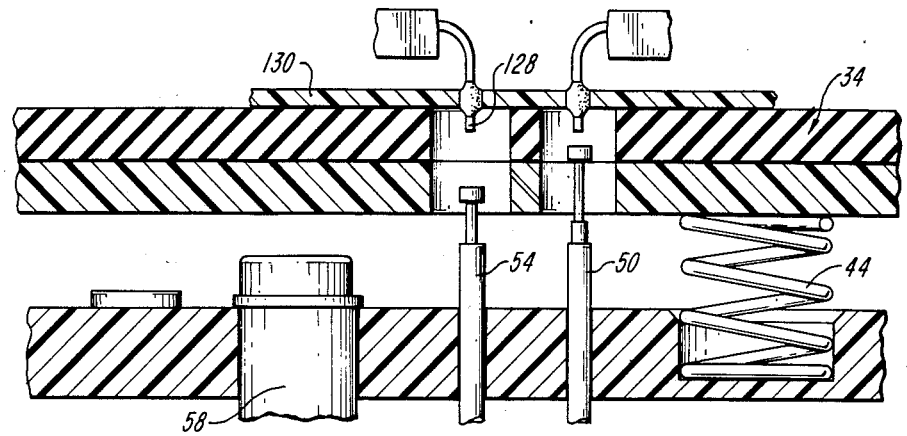
FIG. 5A is a fragmentary sectional view illustrating the bi-level test head in an unactuated position of the vacuum actuated bi-level test fixture according to the present invention.

In operation, with the switch 116 in the "ON" condition, current flows out of the power supply 110 through the normally closed contact "K4" energizing the relay coil "K3". The energization of the coil "K3" opens the normally closed contact "K3" in the circuit leg of the coil "K5" and in the circuit leg of the coil "K6" which remain in the unenergized condition. The normally open contacts "K5" and "K6" in the circuit of the relays 86, 88, and 76 accordingly remain open preventing the actuation of the spool valve 88 (FIG. 3a) which remains in the state 100 (FIG. 3B). Since no vacuum is applied to the bi-level test fixture when the spool valve is in the state 100, the electronic circuit device receiving face 34 is suspended on the coil springs 44 with the contacts 128 of an electronic circuit device 130 positioned on the face 34 out of electrical and mechanical contact with the probes 50 and 54 of the first and second arrays as shown in FIG. 5a. Simultaneously therewith, the lamp 124 is energized providing a visual indication that the system is in the "OFF" state, and the vacuum chamber is connected to ambient atmosphere through the "EA" to "A" path of the spool valve 66 via the members 82, 80, 78, 72, 76, and 74 (FIG. 3A).

Figure 5B:
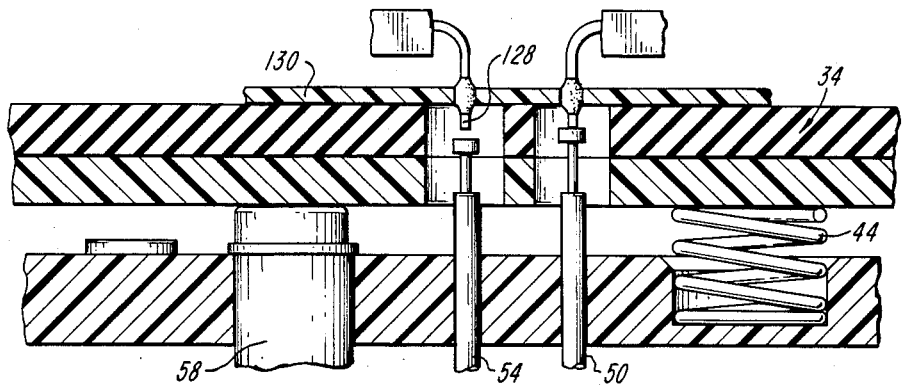
FIG. 5B is a fragmentary sectional view illustrating the bi-level test head in one actuated position of the vacuum actuated bi-level test fixture according to the present invention.

Whenever the power switch "SW1" is closed and the switch 112 is closed, the coil "K1" is energized by the power supply 112 through the normally closed contact "K4". In this case, the normally open contacts "K1" in the circuit legs of the coil "K5" are closed energizing the coil "K5". The energization of the coil "K5" closes the normally open contact "K5" in the circuit of the relay 86 causing the spool valve 66 (FIG. 3A) to assume the state 98 (FIG. 3B). With the spool valve in the state 98, the vacuum source 18 (FIG. 1) is connected through the vacuum controller 64 (FIG. 3A) to the bi-level test head 24 (FIG. 2) which allows ambient atmospheric pressure to press the electronic circuit device receiving face 34 downwardly, compressing the coil springs 44 and the buttons 58, as illustrated in FIG. 5B. The face 34 assumes the state illustrated because the upward force provided by the springs is less than the downward atmospheric pressure induced force. The contacts 128 of the electronic circuit device 130 positioned on the electronic circuit device receiving face 34 are thereby brought into contact with the probes 50 as well as with the probes 54 for testing by the automatic test equipment. Simultaneously therewith, the normally open contact "K5" in the path of the lamp 120 is closed by the energization of the coil "K5" lighting the lamp 120 indicating that the "FULL" vacuum has been delivered to the bi-level test head.

Figure 5C:
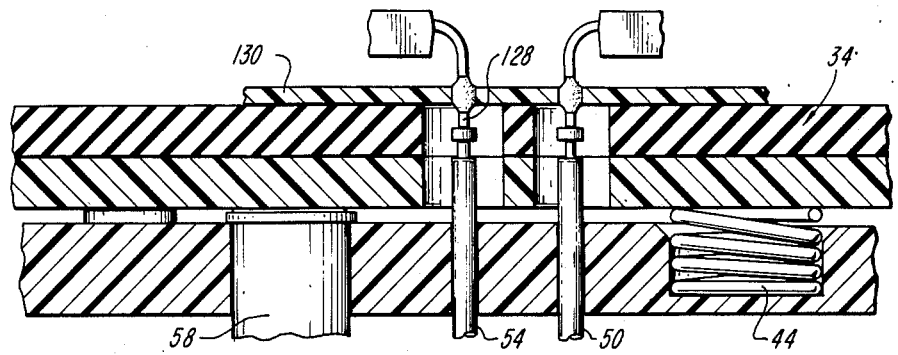
FIG. 5C is a fragmentary sectional view illustrating the bi-level test head in another actuated position of the vacuum actuated bi-level test fixture according to the present invention.

Whenever the switch "SW1" is closed and the switch 114 is closed, power from the power supply 110 flows through the normally closed contact "K4" and energizes the coil "K2". The energization of the coil "K2" closes the normally open contacts "K2" in the circuit legs of the coil "K6" therewith energizing the coil "K6" by the power supply 110. The energization of the coil "K6" in turn closes the normallly open contact "K6" in the circuit path of the solenoid 88 of the spool valve 66 (FIG. 3A). Therewith, the "EA" port is connected to the "A" port and the "P" port is connected to the "B" port as illustrated by the bracket 102 in FIG. 3B. The vacuum applied by the vacuum source 18 (FIG. 1) is thereby connected through the ports "P", "B" to the vacuum regulator 84 (FIG. 3A). Simultaneously therewith, the vacuum chamber of the bi-level test head is connected to ambient through the nozzle 74 via the normally open solenoid actuated valve 76, through the "EA" to "B" ports of the spool valve 66 (FIG. 3A) allowing rapid dissipation of the high level of vacuum in the chamber. The vacuum switch 90 (FIGS. 3A and 4) connected to the fluid manifold 80 through the conduit 92 (FIG. 3A) is operative in response to fall of the vacuum level to close the normally open solenoid 76 (FIG. 3A and 4) when the level of the vacuum approaches a preselected threshold, closing off the connection to ambient. The output of the vacuum regulator 84 (FIG. 3A) then applies a preselected lower vacuum to the bi-level test head that is sufficient to draw the electronic circuit device receiving face 34 downwardly against the coil springs 44, but insufficient to overcome the resilience provided by the buttons 58, as illustrated in FIG. 5C. In this case, the contacts 128 of the electronic circuit device 130 selectively electrically and mechanically contact the probes 50, but not the probes 54, for testing by the automatic testing equipment. Simultaneously therewith, the lamp 122 is energized providing a visual indication that the partial vacuum condition is applied to the bi-level test head.

It will be appreciated that the high vacuum level can be used to provide functional testing, and that the comparatively lower vacuum level can be used to provide in-circuit testing, and conversely, without departing from the inventive concept. It will also be appreciated that the automatic testing equipment, by providing control signals for actuating the appropriate ones of the transistor switches "Q1", "Q2", and "Q3", can selectively control the vacuum actuated bi-level test fixture remotely for both in-circuit and functional testing.

Many modifications of the presently disclosed invention will be apparent to those skilled in the art without departing from the scope of the appended claims.

What is claimed is:

1. A bi-level test fixture connectable to automatic testing equipment for providing in-circuit and functional testing of an electronic circuit device, comprising:
    a first plurality of spring-loaded probes having ends fastened to the test fixture for providing a first plurality of stationary signal contacts on a first level defining an in-circuit testing array;
    a second plurality of spring-loaded probes having ends fastened to the test fixture for providing a second plurality of stationary signal contacts the ends of which terminate on a second level different from the first level defining a functional testing array;
    an electronic circuit device receiving face; and
    means for mounting the electronic circuit device receiving face to the test fixture for movement both to the first level for electrically connecting the electronic circuit device received on the electronic circuit device receiving face to the in-circuit testing array for in-circuit testing by the automatic testing equipment, and for movement to the second level for electrically connecting the electronic circuit device received on the electronic circuit device receiving face to the functional testing array for functional testing by the automatic testing equipment.

2. The invention of claim 1, further including means coupled to the test fixture for selectively moving the electronic circuit device receiving face to the first and to the second levels.

3. The invention of claim 2, wherein said bi-level test fixture includes a vacuum chamber subjacent said electronic circuit device receiving face, and wherein said means for selectively moving said electronic circuit device receiving face includes means coupled to said vacuum chamber for selectively providing a first comparatively large vacuum pressure and a second comparatively lower vacuum pressure to the vacuum chamber.

4. The invention of claim 3, further including means coupled to said vacuum chamber operative in response to a transition from said comparatively higher to said comparatively lower vaccuum pressure, and operative in response to a transition from said first and said second vacuum pressures to ambient, for controllably venting said vacuum chamber to ambient.

5. The invention of claim 3, wherein said means for selectively providing said first and said second vacuum pressures includes a vacuum source for providing said first vacuum pressure, a vacuum regulator operative in response to said first vacuum pressure for providing said second vacuum pressure, and means for selectively switching said first vacuum pressure to said vacuum chamber and said second vacuum pressure to said vacuum chamber.

6. The invention of claim 5, wherein said selecting means includes a plurality of operator actuatable switches.

7. The invention of claim 5, wherein said selecting means includes a plurality of automatic testing equipment actuatable switches.

8. The invention of claim 3, wherein said means for selectively moving the electronic circuit device receiving face includes a plurality of compression springs having a combined tension selected to be larger than said second vacuum pressure but less than said first vacuum pressure that are positioned to abut said electronic circuit device receiving face whenever at least one of said first and said second vacuum pressure are selectively applied to said vacuum chamber.

9. The invention of claim 1, wherein said first and second pluralities of probes are POGO spring loaded probes.

* * * * *